United States Patent
Berman et al.

(10) Patent No.: US 7,098,996 B1
(45) Date of Patent: Aug. 29, 2006

(54) OPTICAL ERROR MINIMIZATION IN A SEMICONDUCTOR MANUFACTURING APPARATUS

(75) Inventors: Michael J. Berman, West Linn, OR (US); George E. Bailey, Welches, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/075,195

(22) Filed: Mar. 7, 2005

Related U.S. Application Data

(62) Division of application No. 10/243,562, filed on Sep. 13, 2002, now Pat. No. 6,885,436.

(51) Int. Cl.
*G03B 27/54* (2006.01)
*G03B 27/62* (2006.01)
*G03B 27/68* (2006.01)

(52) U.S. Cl. .............................. 355/75; 355/52; 355/67
(58) Field of Classification Search ................... 355/52, 355/55, 67, 75; 430/5
See application file for complete search history.

(56) References Cited

U.S. PATENT DOCUMENTS

| | | | |
|---|---|---|---|
| 5,422,704 A * | 6/1995 | Sego | 355/53 |
| 5,691,088 A * | 11/1997 | Kubota et al. | 430/5 |
| 5,883,703 A | 3/1999 | Knirck et al. | |
| 6,101,237 A * | 8/2000 | Miyachi et al. | 378/35 |
| 6,192,100 B1 * | 2/2001 | Acosta et al. | 378/35 |
| 6,337,161 B1 * | 1/2002 | Chiba et al. | 430/5 |
| 6,480,260 B1 | 11/2002 | Donders et al. | |
| 6,524,754 B1 * | 2/2003 | Eynon | 430/5 |
| 6,731,378 B1 * | 5/2004 | Hibbs | 355/75 |
| 6,847,434 B1 * | 1/2005 | Laganza et al. | 355/75 |
| 2002/0145714 A1 | 10/2002 | Hirayanagi | |
| 2003/0179354 A1 | 9/2003 | Araki et al. | |
| 2003/0234915 A1 | 12/2003 | Hickman | |

\* cited by examiner

*Primary Examiner*—Rodney Fuller
(74) *Attorney, Agent, or Firm*—Beyer Weaver & Thomas

(57) ABSTRACT

Provided are systems and methods for overcoming optical errors occurring from reticle and other hardware usage in a semiconductor fabrication apparatus. The systems and methods minimize optical errors, such as those resulting from gravitational sag on a reticle or mask, for a pattern being projected onto a wafer. The reduced errors allow larger reticles and masks to be used—while maintaining optical accuracy; and also improve optical budget management.

16 Claims, 4 Drawing Sheets

OPTICAL ERROR MINIMIZATION IN A SEMICONDUCTOR MANUFACTURING APPARATUS

RELATED APPLICATIONS

This is a Divisional application of co-pending prior U.S. application Ser. No. 10/243,562, entitled "OPTICAL ERROR MINIMIZATION IN A SEMICONDUCTOR MANUFCTURING APPARATUS", filed on Sep. 13, 2002, now U.S. Pat. No. 6,885,436 which is incorporated herein by reference and from which priority under 35 U.S.C. § 120 is claimed.

BACKGROUND OF THE INVENTION

1. Field of the Invention

The present invention relates to photolithographic systems used in semiconductor wafer fabrication. More particularly, the present invention relates to systems and methods for reducing optical errors for a pattern projected onto a wafer in a semiconductor fabrication apparatus.

2. Background

Semiconductor wafer fabrication involves a series of processes used to create semiconductor devices and integrated circuits (ICs) in and on a semiconductor wafer surface. Fabrication typically involves the basic operations of layering and patterning, along with others such as doping and heat treatments. Layering is an operation used to add thin layers of material (typically insulator, semi-conductor or conductor) to the surface of the semiconductor wafer. Patterning is an operation that is used to remove or implant dopants into specific portions of the top layer or layers on the wafer surface. Patterning is usually accomplished through the use of photolithography (also known as photomasking) to transfer a semiconductor design to the wafer surface.

Patterning is often used to expose an area to be etched, such as to create a trench for creation of an isolation structure. A 'reticle' is a hard copy of a pattern recreated in a thin layer of an opaque material, such as chrome, deposited on a glass or quartz plate. The reticle may be used directly in the patterning process to project a pattern—or image—onto a wafer. Alternatively, the reticle may be used indirectly to produce a photomask. The photomask, or 'mask', is also a glass plate with a thin chrome layer on the surface used to pattern or expose an area to be etched. Often, the reticle or mask is covered with many copies of the circuit pattern. The reticle or mask is then used to pattern a whole wafer surface in one pattern transfer.

Photolithographers define optical budget as a combination of resolution, or the minimum line space that can be resolved with a pattern, and depth of focus, the range at which the light patterning projection maintains a predefined accuracy. References to optical budget can also relate to pattern displacement from one layer to another.

Semiconductor device sizes have decreased dramatically over the years. Reaching sub-micron IC feature sizes and patterns has introduced new problems. Currently, photolithographers are looking toward removing the sag of a reticle, or mask, due to gravity as it sits on a reticle stage. Gravitational sag is currently the main obstacle to optical budget management. For six inch by six-inch mask, gravitational sag robs a major portion of the total focus budget. With plans to increase mask size to 9 by 9 inches, gravitational sag is expected to exceed over 60 percent of the optical budget. In addition to gravitational sag, other hardware realities are hindering current patterning techniques.

In view of the above, what is needed are solutions for addressing inaccuracies in photolithography introduced by hardware used in a semiconductor apparatus.

SUMMARY OF THE INVENTION

The present invention provides systems and methods for overcoming optical errors occurring from reticle and other hardware usage in a semiconductor fabrication apparatus. The systems and methods minimize optical errors, such as those resulting from gravitational sag on a reticle or mask, for a pattern being projected onto a wafer. The reduced errors allow larger reticles and masks to be used—while maintaining optical accuracy—and also improve optical budget management, thereby allowing a designer to maintain flatness in the field of focus.

In one aspect, the present invention relates to a semiconductor fabrication apparatus for producing a photolithographic image on a wafer. The apparatus comprises a light source that emits light for transmission onto the wafer. The apparatus also comprises a reticle that transmits a portion of the light emitted by the light source and produces the photolithographic image. The apparatus additionally comprises means for minimizing optical errors arising from hardware usage in the semiconductor fabrication apparatus.

In another aspect, the present invention relates to a reticle for transmitting light to produce a photolithographic image. The reticle comprises a holding portion that maintains the position of the reticle in a semiconductor fabrication apparatus. The reticle also comprises a light transmission portion, comprising an opaque pattern, which permits light transmission capable of producing an image determined by the opaque pattern. The reticle is constructed with a geometry that minimizes optical errors in the image occurring from reticle usage in the semiconductor fabrication apparatus.

In yet another aspect, the present invention relates to a semiconductor fabrication apparatus for producing a photolithographic image. The apparatus comprises a light source that produces light for transmission to a wafer. The apparatus also comprises a reticle for transmitting light along a light path between the light source and the wafer to produce the photolithographic image on the wafer. The apparatus further comprises an optical compensator that affects light produced by the light source and incident on the wafer, and accommodates for optical errors on the wafer occurring from hardware used in the semiconductor fabrication apparatus.

In yet another aspect, the present invention relates to a method for reducing optical errors of an image projected on a wafer in a semiconductor apparatus. The method comprises bonding one or more substantially rigid portions of a pellicle to a reticle such that the combined reticle and pellicle structure minimizes any optical errors of the image projected on the wafer by the reticle.

In another aspect, the present invention relates to a method for reducing optical errors of an image patterned on a wafer in a semiconductor apparatus. The method comprises controlling a pressure regulation system within the semiconductor fabrication apparatus such that a differential pressure is applied across a reticle, wherein the differential pressure minimizes any optical errors of the image projected on the wafer by the reticle.

These and other features and advantages of the present invention are described below with reference to the drawings.

DETAILED DESCRIPTION OF THE PREFERRED EMBODIMENTS

In the following description, numerous specific details are set forth in order to fully illustrate preferred embodiments of the present invention. It will be apparent, however, that the present invention may be practiced without limitation to some specific details presented herein.

Although the following discussion will primarily focus on a reticle, the terms mask and reticle are used interchangeably herein—and in the semiconductor industry—and are not intended to have any differential meeting within this document. Thus, the optical error correction techniques described herein are well suited to address errors for both masks and reticles, and the present invention is not intended to be limited to the specific reticle constructions described below.

As the term is used herein, optical errors refer to deviations in an image projected onto a wafer away from the ideal pattern to be projected. In some cases, the errors arise from deformations in hardware employed in the semiconductor apparatus. For example, as will be described in further detail below, embodiments of the present invention may be used to minimize optical errors arising from gravitational sag and mask chucking.

Figure 1:
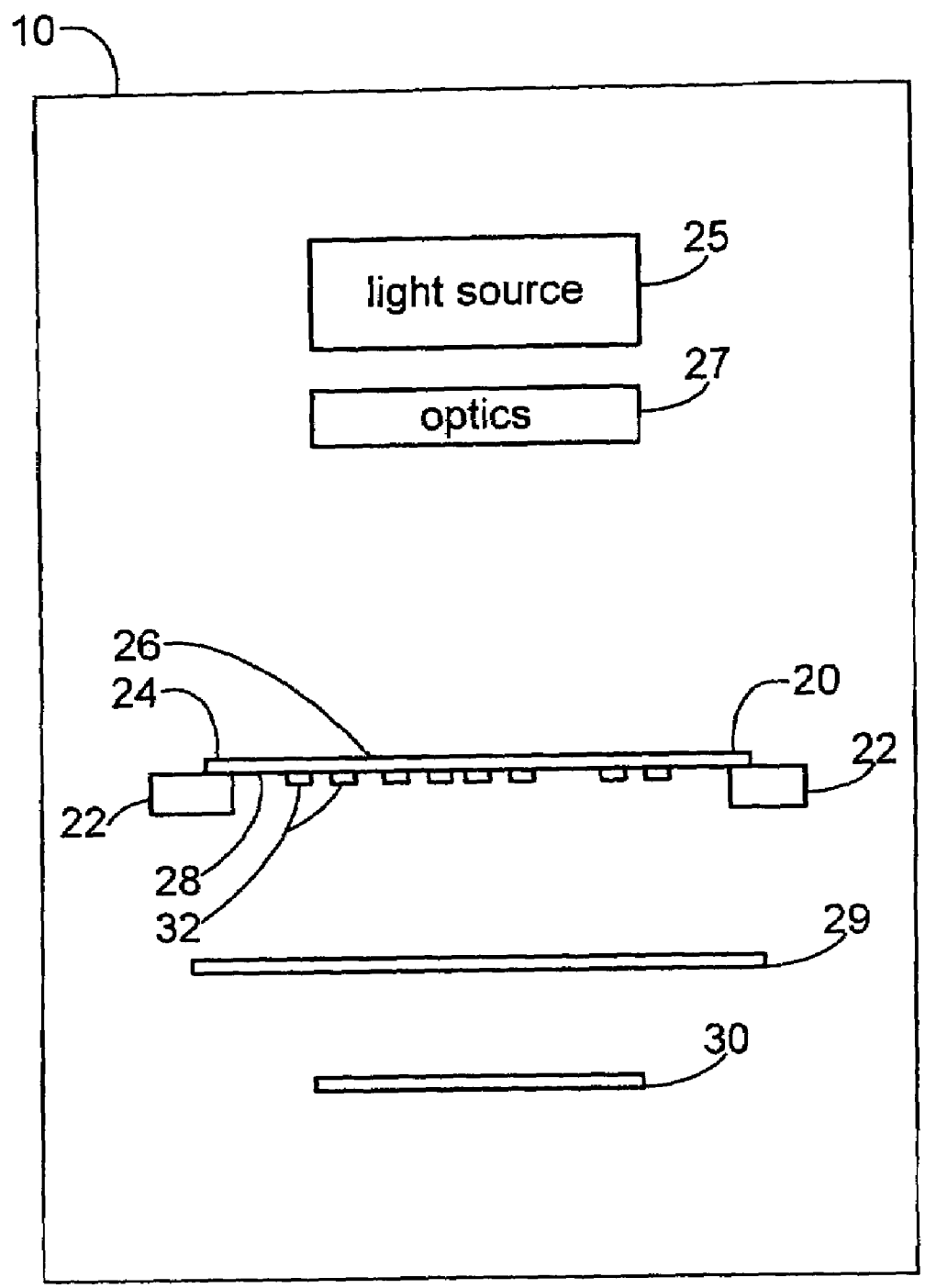
FIG. 1 illustrates a simplified semiconductor fabrication apparatus in accordance with one embodiment of the present invention.

FIG. 1 shows a simplified illustration of a semiconductor fabrication apparatus 10 in accordance with one embodiment of the present invention. Apparatus 10 comprises a light source 25 that generates light for producing a photolithographic image on wafer 30. Optics 27 are included to modify light produced by light source 25 according to a specific application. For example, optics 27 may include one or more filters that modify light produced by light source 25 to produce a desired lighting effect on wafer 30. Light source 25 and wafer 30 may be any of those known in the semiconductor manufacturing arts. In a specific embodiment, light source 25 is a 5000 Series laser as produced by Cymer, Inc. of San Diego, Calif. Other suitable models produced by Cymer include the 248, 193, and 157 nm lasers. There are also other suitable lasers such as those based on mercury arc lamps Reticle 20 is disposed along a light path between light source 25 and wafer 30 and transmits a portion of the light emitted by light source 25 by diffraction of reticle 20 to produce a photolithographic image on wafer 30. For most semiconductor fabrication apparatus, the pattern transmitted onto wafer 30 is smaller than the pattern incident on the reticle. To reduce the size of the image, a projection lens 29 is disposed between the reticle and wafer to reduce the size of the image from the reticle to the working size on the wafer. For example, the pattern on reticle 20 may be reduced 10×, 5×, or 4× by projection lens 29. Reticle 20 comprises a holding portion 24 and a light transmission portion 26.

Holding portion 24 allows reticle 20 to be located and held in semiconductor fabrication apparatus 10. To do so, holding portion typically interfaces with some kind of fixture mechanism in apparatus 10. The fixturing mechanism may be responsible for a) locating reticle 20 within the apparatus, and b) applying one or more forces that hold reticle 20 in position. As shown, reticle 20 rests upon reticle stage 22. Stage 22 supports reticle 20 around reticle 20 peripheries by countering gravitational forces pulling downward on reticle 20. In some cases, all perimetric edges of reticle 20 rest on stage 22. In other designs, a subset of reticle 20 edges, such as two opposing sides, rest on stage 22. Stage 22 may also include a number of locating features that position reticle 20 two-dimensionally in the plane. In one embodiment, a chuck applies suction or vacuum forces to the bottom surface 28 of reticle 20 to maintain reticle 20 in a constant position. In this case, holding portion 24 includes any portions of reticle 20 the interface with the suction elements of the chuck. Some chucks rely on other holding mechanisms such as grasping elements, and the holding portion then comprises portions of reticle 20 that interface with the grasping elements.

Light transmission portion 26 comprises a light transmission pattern on one surface of reticle 20 that blocks or affects light passage therethrough according to the pattern. As shown, portion 26 comprises an opaque material 32 such as chrome on the bottom surface 28 of reticle 20 proximate to wafer 30. Opaque material 32 prevents light from passing through reticle 20, and creates an image on reticle 20 according to the desired pattern for wafer 30.

During transmission of light from light source 25 to wafer 30, optical errors are encountered in apparatus 10. To compensate for optical errors or deviations away from the desired pattern on wafer 30, apparatus 10 employs one or more devices and methods that compensate for any optical deviations from the desired light pattern on wafer 30. In one aspect, means for affecting light transfer onto wafer 30 are included in apparatus 10 to compensate for optical deviations resulting from gravitational sag of reticle 20.

In one embodiment, reticle 20 is constructed with a geometry that compensates for optical deformations occurring from reticle 20 usage in the semiconductor fabrication apparatus. As shown in FIG. 1, reticle 20 is prone to gravitational sag in the central light transmission portion 26 since its peripheral edges are supported by stage 22. To compensate for any gravitational sag, reticle 20 is constructed with a geometry that corrects light transmission deviations resulting from gravitational sag while resting on stage 22.

Since the physics of disposing reticle 20 in apparatus 10 are substantially constant (e.g., gravity and reticle 20 has a known mass distribution, position, etc.), deformations of reticle 20 from an ideal planar surface may be modeled and pre-determined before implementation. These pre-determined deformations include any undesirable optical effects produced on wafer 30 resulting from gravitational sag or other structural or positional deviations of reticle 20 from an ideal planar surface. In addition to modeling before implementation, deformations may also be derived using empirical data from previous reticle deployments, gained via an inferometer or another suitable optical measurement technique.

With these deviations and deformations known, it is possible to construct a non-planar reticle 20 for use in apparatus 10 that compensates for deformation occurring during reticle 20 usage. In one embodiment, reticle 20 is constructed with a substantially non-planar geometry that compensates for deformation resulting from gravitational sag. An upward arch in the reticle before deployment in the apparatus 10 is suitable for some applications. Alternatively, a non-planar surface polished into the reticle may be suitable to correct for any gravitational sag. During implementation, the combination of an intentionally constructed nonplanar surface for reticle 20 and gravitational sag within apparatus 10 is substantially linear light transmission through reticle 20, resulting in a desired image on wafer 30. The curvature may be applied to the top or bottom surface (or both) of reticle 20. In a specific embodiment, reticle 20 is constructed with an upward arch that compensates for deformation resulting from gravitational sag.

A custom geometry or curvature for reticle 20 may be achieved using conventional glass construction techniques. Thus, a predetermined curvature may be determined for reticle 20 and provided to a reticle manufacturer. One suitable construction technique uses a mold. Alternatively, a reticle may be heated and polished on both sides using conventional polishing techniques to achieve the desired curvature. In a specific embodiment, reticle 20 has a reverse curvature from about 100 nm to about 120 nm when reticle 20 comprises a glass and dimensions of six by six inches. Further, a reverse curvature from about 170 nm to about 200 nm may be suitable for a reticle 20 comprising glass and dimensions of nine by nine inches. These values are z component of the sag assuming a vacuum clamped reticle of a standard 6.35 mm thickness.

In some cases, reticle 20 may reduce optical distortions resulting from usage from about 80 nm to about 3 to 5 nm in this manner (for a six by six reticle). Reticle 20 may also be constructed to accommodate for non-linear and other higher order light distortions associated with hardware use within apparatus 10, such as those associated with holding reticle 20 with a chuck that slightly deforms the reticle.

Reducing errors in the optical projection will maintain flatness in the field of focus—thereby improving optical budget management. As a result, there can be an increase in resolution and/or depth of focus.

Another technique to accommodate for optical deviations on wafer 30 uses an optical compensator disposed along the light path emitted from light source 25 and wafer 30. Because the geometric deformation to gravitational sag and corresponding optical deviations are substantially constant within an apparatus, the optic path used in the apparatus may be altered to correct for the distortion. In one embodiment, optical error minimization is achieved using the primary lens for the projection. In another embodiment, a new lens element is inserted into the optical path between the light source 25 and wafer 30 to correct for any optical deviations on wafer 30.

Figure 2:
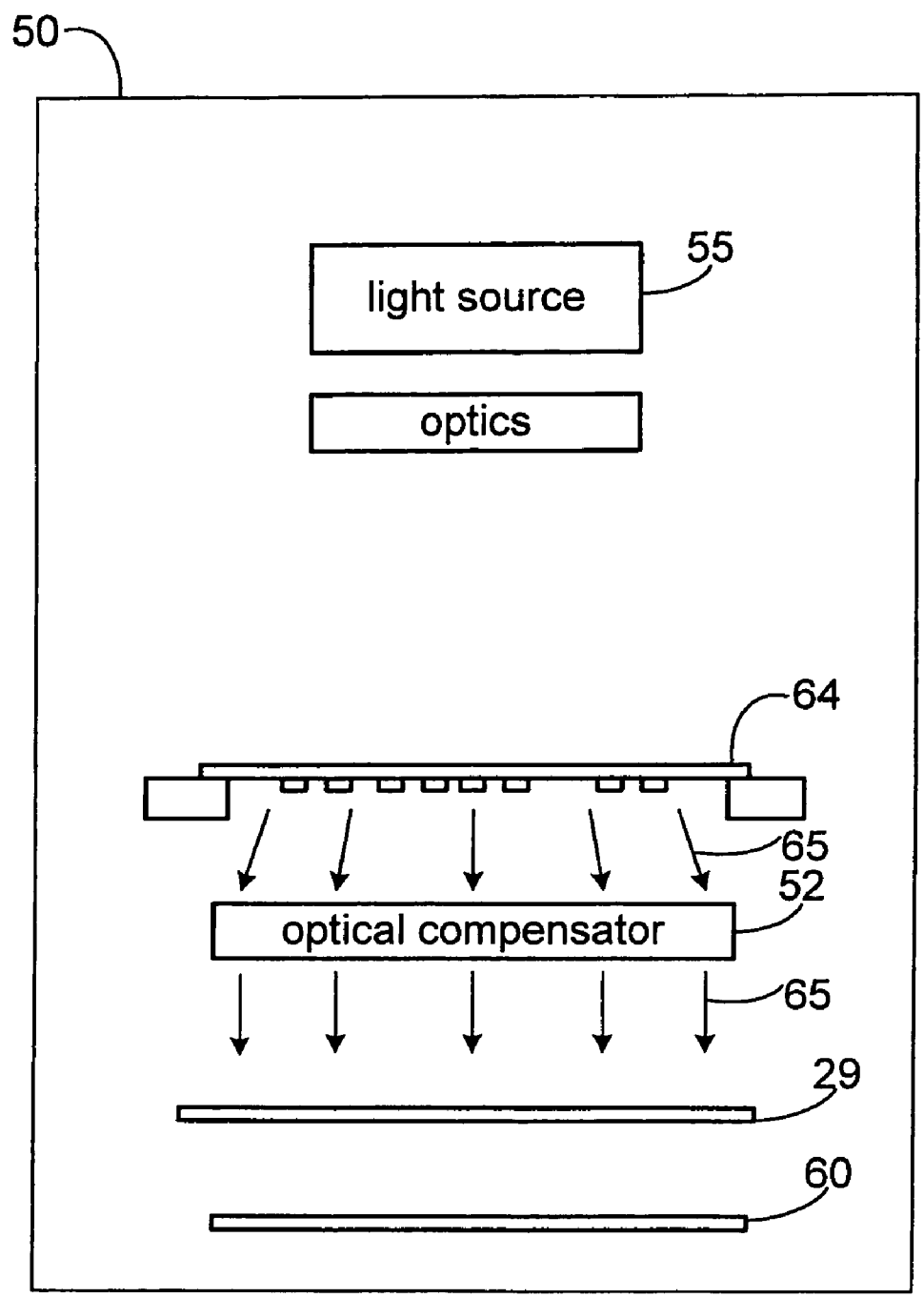
FIG. 2 illustrates an optical compensator disposed in semiconductor fabrication apparatus to improve light patterning on a wafer in accordance with another embodiment of the present invention.

FIG. 2 illustrates an optical compensator 52 disposed in a semiconductor fabrication apparatus 50 to improve light patterning in accordance with another embodiment of the present invention. In another embodiment, optical compensator 52 is placed above the mask to manipulate the cone of light converging onto the reticle plane. Semiconductor fabrication apparatus 50 produces a photolithographic image on wafer 60. Light source 55 produces light that is altered along its path between emission by light source 55 and reception by wafer 60. Reticle 64 transmits some of the light emitted by light source 55 to produce a photolithographic image on wafer 60. At one or more points during light transmission between emission by light source 55 and wafer 60, factors that undesirably affect an ideal light pattern for wafer 60 may be encountered. For example, sag of reticle 64 may contribute to light deviations.

Regardless of the how optical errors are produced within apparatus 10, optical compensator 52 is disposed to improve image accuracy for wafer 60. Optical compensator 52 is well suited to correct and/or accommodate for optical deviations associated with reticle 64, such as gravitational induced sag in reticle 64. In one embodiment, compensator 52 is a transparent medium that affects light transmission therethrough to improve light transmission onto wafer 60. Typically, the change in light that compensator 52 causes as received relative to output is minimally different. Similar to the embodiments described with respect to FIG. 1, a designer may know what optical changes are desired within system 60 based on empirical measurements or modeled optical deviations for the reticle, and then design or adapt an optical compensator 52 that alters light accordingly.

In one embodiment, compensator 52 is a curved lens that accommodates for any optical variations produced by gravitational sag in reticle 64. Disposing a lens as compensator 52 along the light path between reticle 64 and wafer 60 works well in this regard for many systems. When disposed between reticle 64 and wafer 60, the lens bends light transmitted through reticle 64 to compensate for the gravitational sag. Thus, if reticle 64 is concave downward due to gravity and light correspondingly bends slightly outward, compensator 52 may employ a concave downward lens or surface to return the light to a downward linear path. Light lines 65 in FIG. 2 exaggerate this effect for illustrative purposes.

The distance between reticle 64 and the lens compensator 52 may vary with the physics of an application. In a specific embodiment, lens compensator 52 is between about 5 cm and about 15 cm below reticle 64. The material of compensator 52 will also affect the geometric setup. For example, compensator 52 may comprise a quartz lens that is sliced and polished to precise curvature dimensions according to the desired light transmission effects of an application. Again, the amount of polishing and curvature for the lens will vary with the application, including factors such as the size and deflection of reticle 64, and its material properties. Lens polishing and shaping is well known to those in the lens and stepper vender industries. For example, with known dimensions for the lens, such a lens may be obtained from Nikon of Belmont, Calif.

The present invention also provides additional means for achieving optical correction resulting from gravitational sag of a reticle. In another aspect, the present invention bonds one or more substantially rigid portions of a pellicle frame to a reticle such that optical errors produced by reticle gravitational sag are reduced. More specifically, this technique bonds a substantially rigid pellicle to the reticle. When fixed together, the pellicle/reticle combination increases the aggregate stiffness resistant to bending of the reticle, and reduces optical errors of an image patterned on a wafer induced by reticle bending.

Figure 3:
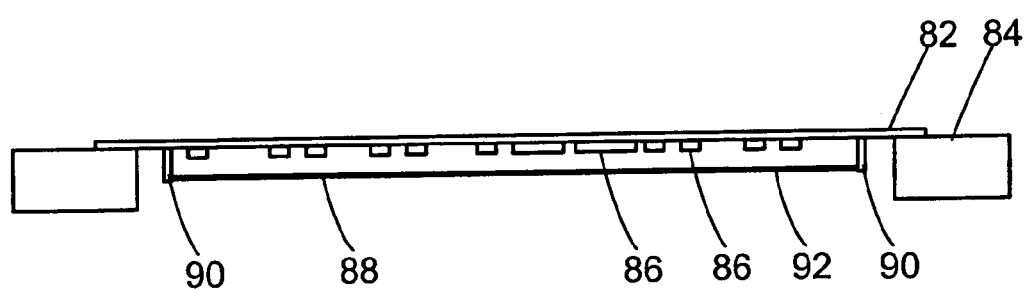
FIG. 3 shows an illustrative cross-section of a pellicle bonded to a reticle in accordance with another embodiment of the present invention.

Referring to the simplified cross-section of FIG. 3, a combined pellicle/reticle embodiment is shown. The periphery of reticle 82 rests upon stage 84. Opaque features 86 are disposed of the bottom side of reticle 82 according to a desired pattern to be imaged onto a wafer. Reticle 82 includes deformations or imperfections during implementation in a semiconductor fabrication apparatus that result in optical errors and deviations in a wafer image. As described above, the deformations may include those induced by gravitational sag in the central portion of reticle 82.

Pellicle 88 comprises a thin layer of optically neutral polymer 92 stretched onto a frame 90. Pellicle 88 i) keeps dust and defects out of the focus plane of reticle 82, and ii) increases the aggregate stiffness of the combined reticle 82 and pellicle 88 structure. To act as a dust and defect barrier, pellicle 88 comprises a thin flexible membrane 92 that stands off the surface of reticle 82 and prevents dust and defects from reaching the surface of reticle 82. For example, membrane 92 may stand off reticle 82 at a distance from about 1/16 inches to about 1/2 inches. Some vendors specifically note a stand off distance from 4.5 to 2.6 mm. A stand off distance of about 2.5 to 5 mm may also be suitable for some designs. At the standoff distance, thin membrane 92 holds dirt particles out of the focal plane of reticle 82. In effect, the particles become transparent to the transmitting light since the focal point for the dirt has shifted outside a significant distance of the focal path. Pellicle 88 is also useful for preventing scratches on reticle 82 surface.

To increase the aggregate stiffness of the combined reticle 82 and pellicle 88 structure, frame 90 is fixed to reticle 82. As shown in FIG. 3, pellicle 88 is bonded to the bottom side of reticle 82 to accommodate optical errors produced as a result of gravitational sag in reticle 82. Bonding may comprise an adhesive suitable for fixing two solids together, such as an adhesive adapted to the two materials of reticle 82 and pellicle 88 (e.g., a glass-metal adhesive), or any other suitable means for fixing two solids together as known in the art. In contrast to conventional pellicles, pellicle 88 uses a stiffened frame 90. The compliant frame for a conventional pellicle is used only to support the thin membrane 92 at the stand off distance. However, stiffened frame 90 increases the stiffness of the bonded reticle 82 and pellicle 88, which together act as a common structure with combined stiffness, by including one or more of a) a stiffer material in frame 90 and b) an increased thickness of frame 90 and/or its constituent elements.

In one embodiment to increase the stiffness of frame 90, and thereby improve the stiffness of the combined pellicle 88 and reticle 82, solid or highly rigid members of frame 90 may be employed. By way of example, the members may be have an elastic Modulus greater than about 60 GPa and comprise anodized aluminum. In addition, the rigid members may employ high rigidity materials not conventionally used in pellicle construction. Such materials include Invar, a trademark of Imphy SA of France, with a elastic modulus of 138 GPa, and an alloy of titanium with 3% aluminum and 2.5% vanadium having an elastic modulus of about 103 GPa.

In another embodiment, the rigid members of frame 90 may be larger than their traditional counterparts For example, conventional frame members for a pellicle typically comprise a cross-section of 3–5 mm by 3–5 mm. Pellicle 88, however, may comprise members having a cross-section greater than 5 mm in one or more dimensions, and often ranging from about 150% to about 250% the size of their conventional counterpart, based on the overall size of the reticle. In come cases, the total range of sizes may be limited and increasing the width dimension may have more of an impact.

The dimensions of frame 90 may be adjusted according to the dimensions of pellicle 88 and reticle 82. Typically, frame 90 is disposed perimetrically outside of features 86 in the opaque material disposed on reticle 82. In one embodiment, frame 90 is designed to fit just within the outer bounds of reticle 82 and thus has a shape determined by the size and shape of reticle 82. In general, as the size and stiffness of frame 90 increases, the combined stiffness of reticle 82 and pellicle 88 increases, and optical errors produced as result of reticle 82 gravitational sag are reduced.

In addition to increasing the stiffness of the bonded pellicle 88 and reticle 82 structure, a stiffened pellicle 88 may also be configured to provide a counter-torque that counters any deflection (e.g., bowing) in reticle 82 that contributes to optical errors of an image patterned on the wafer. More specifically, gravitational sag will typically bow reticle 82 downward. To combat this downward bow, pellicle 88 may be designed and implemented with an opposite bow that provides an opposite torque to that caused related to gravitational bowing in reticle 82. For example, when pellicle 88 is disposed of the bottom side of reticle 82, pellicle 88 may be designed and attached to reticle 82 with an upward bow that counteracts the downward gravitational sag in reticle 82. In other words, a pellicle 88 frame convexed slightly upward will tend to push up on reticle 82 and tend to counteract any sag in the reticle.

In yet another aspect of the present invention, a pressure regulation system within the semiconductor fabrication apparatus is used to correct any deformations in a reticle due to gravitational sag. More specifically, a pressure regulation system within the semiconductor fabrication apparatus may be controlled such that a differential pressure is applied across a reticle. The differential pressure induces geometric changes in the reticle that minimize any optical errors in an image projected by the reticle.

Figure 4:
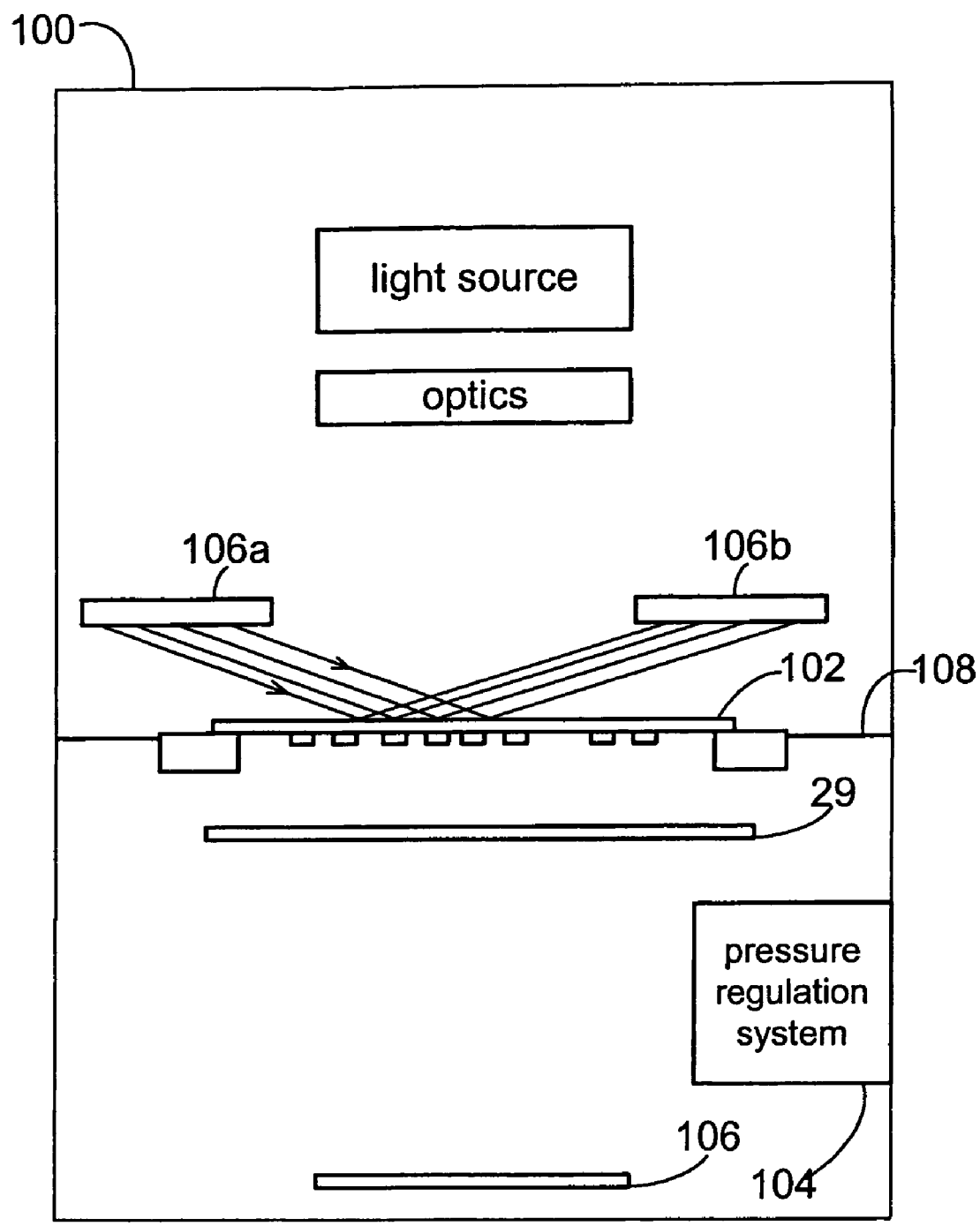
FIG. 4 is a simplified illustration of a pressure regulation system disposed in semiconductor fabrication apparatus to improve light patterning on a wafer in accordance with another embodiment of the present invention.

FIG. 4 is a simplified illustration of a pressure regulation system 104 disposed in semiconductor fabrication apparatus 100 to improve light patterning on wafer 106 in accordance with another embodiment of the present invention. The pressure regulation system 104 controls the differential pressure on opposing surfaces of reticle 102. Reticle 102 includes downward bowing or 'sag' due to gravity.

Pressure regulation system 104 may be deployed above or below (or both sides) reticle 102. Pressure regulation system 104 comprises a gas pressurizing source that increases—or a gas withdrawal source that decreases—pressure local to the source. Thus, the pressure regulation system may apply i) a positive or negative pressure to a volume below the reticle, or ii) apply a positive or negative pressure to a volume above the reticle. The pressure produced by regulation system 104 affects reticle 102 deflection. Pressure regulation system 104 also includes a suitable sensor that provides real time feedback of the pressure being monitored.

In one embodiment directed to alleviate optical errors resulting from gravitational sag of a reticle, pressure regulation system 104 increases pressure below reticle 102. The volume below reticle 102 is sealed via seal 108 such that pressure below the reticle may be increased to the point where a pressurized gas pushes reticle 102 upward to achieve a substantially flat plane for reticle 102. Gases such as $N_2$, CDA, Ar, He, etc. may be suitable for this purpose.

In another embodiment, the volume above reticle 102 is pressure controlled to reduce pressure above reticle 102 such that a pressure differential between top and bottom surfaces of reticle 102 causes reticle 102 to achieve a substantially flat plane for the reticle. In this case, pressure regulation system 104 is disposed above reticle 102 and withdraws gas from the volume above reticle 102.

Pressure control to minimize any optical errors on wafer may rely on suitable feedback and control. Pressure sensing and feedback may be achieved using, for example, optical inferometer techniques. As shown in FIG. 4, optical inferometer 106 measures the amount of non-planar deflection in reticle 102. Inferometer 106 comprises a non-actinic laser source 106a and a detector 106b. Laser source 106a produces light that reflects off reticle 102 and is received by detector 106b. Detector 106b produces information that is fed back to control logic responsible for changing the pressure, either on the top side or bottom side of reticle 102, in order to minimize any optical errors on a wafer being patterned. The control logic may be stored in memory of a processor designed or configured to apply control signals to pressure regulation system 104. An Zygo phase shifting inferometer VeriFire MST as produced by Zygo Corporation of Middlefield, Conn. is suitable for use as inferometer 106. Any suitable processor or computer used in the feedback control arts may be used to execute the control scheme that regulates pressure regulation system output.

Simpler sealing and pressure supply systems are currently available in many semiconductor fabrication apparatus for the purposes of barometric pressure control of the projection lens. Since barometric pressure has an effect on the image that the projection lens transmits, crude barometric pressure control is common in many stepper projection lenses. However, such pressure supply systems are not used to alleviate optical errors of an image patterned on a wafer due to gravitational sag of a reticle, or to alleviate any deviations due to any other hardware in semiconductor fabrication apparatus 100. Further, in the case of reticle gravitational sag, the problem was historically not significant enough for designers to address in any manner. As a result, sensing of reticle deformation for purposes of feedback control, and logic to respond to errors introduced as a result of sag, are not available. For example, some conventional pressure supply systems provide a crude pressure control above reticle 102 in the range of −50 kPa to −80 kPa. For pressure control to alleviate reticle gravitational sag on the other hand, pressure control may fluctuate from about 5 to about 20 kPa, depending on the amount of correction desired, the reticle size, and material.

The pressure regulation system of FIG. 4 is also well-suited to minimize optical errors associated with mask bow or reticle bow due to mask chucking and holding. Many reticle systems rely on vacuum chucking or peripheral holding to maintain the position of the reticle. In this case, the active pressure feedback systems described above may be used to test if any optical errors are evident (via optical inferometer 106) due to reticle holding and, if so, minimize the problems via pressure regulation system 104. The measurements made during testing may be compared to preset limits before the holding mechanism is activated. In this manner, the active pressure feedback systems described above may be used to check for a reticle that was not vacuum chucked or held correctly, and apply a suitable correcting pressure. In addition, the active pressure systems may be used to reduce warpage or geometric inconsistencies in the reticle due to combinations of gravitational sag and chuck bow.

One advantage of pressure regulation to achieve correction of any gravitational sag in reticle 102 is that the pressure regulation method is active; in that the pressure may be controlled dynamically to a desired level. In addition, active control of the pressure differential about reticle 102 also allows the pressure regulation systems to resolve and correct for other problems in reticle 102, such as bow or warp due to reticle 102 heating as the reticle is used.

Although the foregoing invention has been described in some detail for purposes of clarity of understanding, it will be apparent that certain changes and modifications may be practiced within the scope of the appended claims. While not expanded upon in detail, decreasing optical errors using the techniques described herein may also be used to improve optical budget management. As resolution and registration accuracy increases, more room is left in the optical budget for depth of focus. One of skill in the art is aware of such manipulation advantages. Therefore, the present embodiments are to be considered as illustrative and not restrictive, and the invention is not to be limited to the details given herein, but may be modified within the scope of the appended claims.

What is claimed is:

1. A method for reducing optical errors of an image protected on a wafer in a semiconductor apparatus, the method comprising:
bonding one or more substantially rigid portions of a pellicle to a reticle such that the combined reticle and pellicle structure minimizes any optical errors of the image projected on the wafer by the reticle wherein the pellicle is configured to provide a counter-torque that counters any deflection in the reticle that contributes to optical errors of the image patterned on the wafer.

2. The method of claim 1 wherein the pellicle increases the aggregate stiffness of the combined reticle and pellicle structure.

3. The method of claim 1 wherein a frame included in the pellicle is fixed to reticle.

4. The method of claim 3 wherein the material used in the frame has an elastic Modulus greater than about 60 Gpa.

5. The method of claim 3 wherein the frame comprises rigid members having a cross-section greater than 5 mm in one dimension.

6. The method of claim 3 wherein the material used in the rigid frame has an elastic Modulus greater than about 60 Gpa.

7. The method of claim 3 wherein the frame has a cross-section greater than 5 mm in one dimension.

8. The method of claim 1 wherein the pellicle includes an upward bow that counteracts downward gravitational sag in the reticle.

9. A method for reducing optical errors of an image projected on a wafer in a semiconductor apparatus, the method comprising:
providing a pellicle with a rigid frame;
bonding the rigid frame to a reticle such that the frame imparts a mechanical torque onto the reticle to counteract image distortion caused by the reticle and thereby correct for optical errors of the image projected on the wafer by the reticle.

10. The method of claim 9 wherein the rigid frame includes bowing, wherein, when the frame is bonded to the reticle, the bowing in the frame is configured to counteract the image distortion caused the reticle.

11. The method of claim 9 wherein the distortion in the image is induced by gravitational sagging in the reticle.

12. The method of claim 9 wherein the rigid frame is fixed to reticle.

13. A method for reducing optical errors of an image projected on a wafer in a semiconductor apparatus, the method comprising:
bonding a rigid portion of a pellicle to a reticle such that the combined reticle and pellicle structure minimizes any optical errors of the image projected on the wafer by the reticle wherein the pellicle is configured to provide a torque that counters any deflection in the reticle that contributes to optical errors of the image patterned on the wafer.

14. The method of claim 13 wherein the frame is configured to induce an upward flexing in the reticle to correct for optical errors in the image caused by gravitational sagging and deflection in the reticle.

15. The method of claim 14 wherein the frame is attached to an upper surface of the reticle.

16. The method of claim 14 wherein the frame is attached to an lower surface of the reticle.

* * * * *